(12) United States Patent
Jasa et al.

(10) Patent No.: US 9,362,874 B2
(45) Date of Patent: Jun. 7, 2016

(54) DIFFERENTIAL MEASUREMENTS WITH A LARGE COMMON MODE INPUT VOLTAGE

(71) Applicant: Fairchild Semiconductor Corporation, San Jose, CA (US)

(72) Inventors: Hrvoje Jasa, Scarborough, ME (US); Andrew M. Jordan, Scarborough, ME (US)

(73) Assignee: FAIRCHILD SEMICONDUCTOR CORPORATION, San Jose, CA (US)

( * ) Notice: Subject to any disclaimer, the term of this patent is extended or adjusted under 35 U.S.C. 154(b) by 0 days.

(21) Appl. No.: 14/291,640

(22) Filed: May 30, 2014

(65) Prior Publication Data

US 2015/0015333 A1    Jan. 15, 2015

Related U.S. Application Data

(60) Provisional application No. 61/844,525, filed on Jul. 10, 2013.

(51) Int. Cl.
*H03F 3/45* (2006.01)
*G01R 19/00* (2006.01)
*G01R 19/165* (2006.01)

(52) U.S. Cl.
CPC ........ *H03F 3/45475* (2013.01); *G01R 19/0023* (2013.01); *G01R 19/16542* (2013.01); *H03F 2200/228* (2013.01); *H03F 2203/45528* (2013.01); *H03F 2203/45564* (2013.01); *H03F 2203/45604* (2013.01)

(58) Field of Classification Search
CPC ............................ H03F 3/45; H03F 2200/228
USPC ....................... 330/11, 69; 327/333
See application file for complete search history.

(56) References Cited

U.S. PATENT DOCUMENTS 8,854,125 B2 * 10/2014 Ikeda .............................. 330/69
2007/0052480 A1 * 3/2007 Pastorina et al. ............. 330/288

FOREIGN PATENT DOCUMENTS

KR       1020150007246 A       1/2015

* cited by examiner

*Primary Examiner* — Steven J Mottola
(74) *Attorney, Agent, or Firm* — Schwegman Lundberg & Woessner, P.A.

(57) ABSTRACT

An apparatus comprises a differential amplifier circuit and a current source. The differential amplifier circuit is configured to receive a voltage at an input, wherein the differential amplifier circuit generates an output voltage having a magnitude proportional to the received voltage over a voltage range to be measured at a specified output common mode voltage. The current source is electrically connected to an input of the differential amplifier circuit and is configured to subtract a midpoint of a voltage range of the battery voltage to be measured at the input of the differential amplifier, wherein a circuit supply voltage provided to the differential amplifier circuit and the current source is less than the voltage at the input.

20 Claims, 2 Drawing Sheets

DIFFERENTIAL MEASUREMENTS WITH A LARGE COMMON MODE INPUT VOLTAGE

CLAIM OF PRIORITY

This application claims the benefit of priority under 35 U.S.C. §119(e) of Jasa et el., U.S. Provisional Patent Application Ser. No. 61/844,525, titled "DIFFERENTIAL MEASUREMENTS WITH A LARGE COMMON MODE INPUT VOLTAGE," filed on Jul. 10, 2013, which is herein incorporated by reference in its entirety.

BACKGROUND

Personal electronic devices include, among other things, MP3 portable media players, cellular telephones, global positioning systems (GPS), and smart phones. Reliance on such devices is increasing as the functions provided by the devices increases. Because the devices are battery powered, it may be desirable to provide information to a user regarding battery capacity and to manage the functionality of the devices as available battery energy is depleted.

BRIEF DESCRIPTION OF THE DRAWINGS

The drawings are not necessarily drawn to scale and illustrate generally, by way of example, but not by way of limitation, various embodiments discussed in the present document.

DETAILED DESCRIPTION

Personal electronic devices can include a battery monitor to give an indication of remaining battery capacity before the batteries need to be recharged or replaced. Typically, a battery monitor measures the voltage of the battery under load to provide an estimate of the remaining battery life. Circuitry of the personal electronic devices may operate on a voltage lower than the battery voltage. For example, the battery to be measured may be a lithium-ion battery and it may be desired to monitor the battery over a voltage range extending from 4.5V (volts) to 2.5V, but the circuitry of the personal electronic device may have a supply voltage of only 1.8V.

A direct measurement of the battery voltage can require special circuitry due to the higher voltage, and operation of the higher voltage circuitry can be costly in terms of battery drain. One approach to monitor the battery voltage is to divide the battery voltage down using resistors to a range that is compatible with the device circuitry at the lower supply voltage. However, this approach can require fabricating integrated resistors that are well matched in resistance value, which can be difficult. Also, dividing down the battery voltage may reduce the dynamic range available for a measurement.

Figure 1:
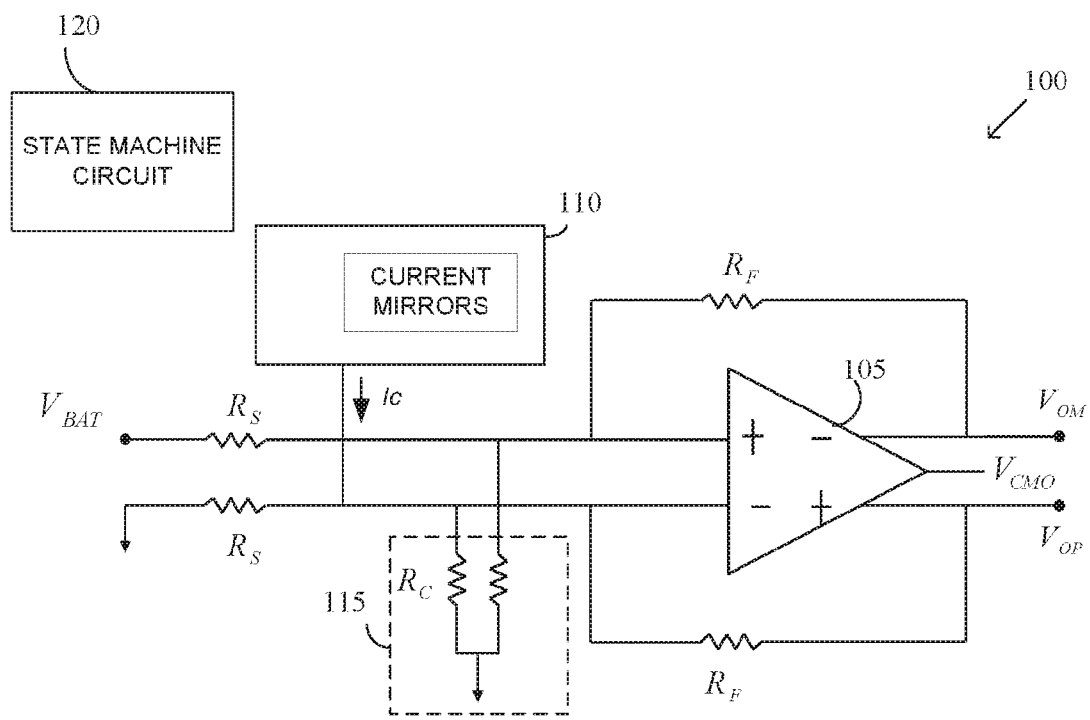
FIG. 1 shows a schematic of an example of a measurement circuit.

FIG. 1 shows a schematic of an example of a measurement circuit 100 useful for measuring a battery voltage. The input to the measurement circuit is the battery voltage. The measurement circuit 100 measures the input directly and generates a differential output signal to provide the greatest amount of dynamic range. The measurement circuit 100 includes a differential amplifier circuit configured to receive a battery voltage at the input to the differential amplifier circuit. The differential amplifier circuit can include a differential operation amplifier or op amp 105. The measurement circuit 100 receives a circuit supply voltage (e.g., $V_{DD}$) that is lower than the battery voltage to be measured.

The output of the measurement circuit is a differential signal having a magnitude proportional to the battery voltage, or $$Vout = G \cdot (Vbat - Voffset) \quad (1),$$

where Vout is a peak-to-peak differential voltage signal, G is the forward gain of the circuit, and Voffset is the midpoint of the voltage range of the battery voltage to be measured or $$Voffset = \frac{Vbat, \max + Vbat, \min}{2}. \quad (2)$$

For example, it may be desired to provide a voltage signal proportional to the battery voltage over a range of about 2.5V to 4.5V using a circuit having a circuit supply voltage of only 1.8V. The midpoint of the range and Voffset is 3.5V, and it is desired to eliminate this offset from the input voltage. However, it can be difficult to create a low noise 3.5V reference and the reference would be above the power rail of the measurement circuitry.

Another approach is to use a current to eliminate the offset. The current can be generated using a voltage that is significantly less than the battery voltage. The measurement circuit 100 includes a current source 110 electrically connected to an input of the op amp 105. In the example shown, the current source is electrically connected to the inverting input of the op amp 105 and provides a current $I_C$ having a value of Voffset/$R_S$, which effectively subtracts the midpoint of the battery voltage range. The current source may be trimmed to set the value of current accurately. In certain examples, the current source 110 can include a number of unit sized current mirrors to generate $I_C$. The trim of the current can involve enabling and disabling current mirrors to size $I_C$. A state machine circuit 120 can be included with the measurement circuit to perform the current trim. A state machine circuit can be a logic circuit that performs a fixed series of steps or progresses through a series of logic states to perform one or more functions. The state machine circuit 120 may perform a successive approximation algorithm to adjust the current to minimize the difference between $I_C(R_S)$ and Voffset.

The forward gain G of the measurement circuit is the ratio of the feedback and source resistor values or $R_F/R_S$. The value of the forward gain G can be set by sizing the resistors. In the example above, G can be set to 1.5 to place the measured input 2.0V dynamic range into the 1.8V circuit supply voltage. The output common mode can be set to 0.9 (the middle of the 1.8V circuit supply voltage), the output swing maximum can be limited to 1.650V and the output swing minimum can be limited to 0.15V. This allows a differential peak to peak swing of 3V. The output voltage generated by the differential amplifier circuit is shifted from the input voltage by the midpoint of the measurement voltage range and has a magnitude proportional to the battery voltage over the voltage range to be measured.

Because the measurement circuit 100 operates using a circuit supply rail that is lower than the battery voltage, it may be useful to adjust the operating voltage or input common mode voltage at the virtual node of the op amp 105. The differential amplifier circuit includes a common mode biasing circuit 115 to adjust the input common mode voltage. In the example shown in FIG. 1, the voltage $V_X$ at the non-inverting terminal of the op amp 105 can be determined by $$V_X = \left(Vcmo + Vmid \cdot \frac{R_F}{R_S}\right) \cdot \left(\frac{Rc \cdot Rs}{Rc \cdot Rs + R_F \cdot (Rs + Rc)}\right).$$

Vcmo is the output common mode voltage, and Vmid is the middle of the dynamic range of the input voltage (e.g., Voffset for the battery voltage range). The addition of the common mode circuit 115 allows for accurate setting of the voltage of node Vx into the circuit supply voltage range. Without the common mode circuit 115, the node Vx could potentially rise above the circuit supply voltage, resulting in failure of the circuit.

The monitoring of the battery voltage can be used to estimate the remaining battery life. In some examples, Information related to the remaining capacity of the batter can be used to alter the operation of the device. For instance, if the measurement circuit is included in a smart phone, functionality of the device may be reduced to preserve the remaining life. Blue tooth functionality may be stopped or only emergency calling may be allowed as the battery continues to deplete. In some examples, Information related to the remaining capacity of the batter can be used to trigger an alert to recharge the batteries.

The measurement circuit 100 can be configured to measure other battery voltages in addition to the examples described. The battery voltage may result from a stack of batteries, or a set of multiple batteries connected in series. A battery stack is sometimes used for power tool applications. The measurement circuit 100 can provide an indication (e.g., a measurement or a signal resulting from a measurement) that the batteries need recharging. The parameters of the circuit can be determined from the equations shown herein. In another example, the measuring circuit 100 can be used to monitor the output of a battery recharging circuit to determine when the recharging is complete.

The measurement circuit 100 has other uses in addition to monitoring a battery voltage. The measurement circuit 100 can be used for any application where it is desired to monitor a voltage using a circuit that has a much lower supply voltage than the monitored voltage. For instance, a sensor circuit may provide a small signal voltage change around a bias voltage with a magnitude of tens of volts while it is desired to monitor the output of the sensor circuit with a measuring circuit having a circuit supply voltage of 1.8V.

As a non-limiting example, such a sensor circuit can include a strain gauge sensor biased using a wheatstone bridge circuit. The wheatstone bridge circuit may provide a bias voltage of about 5V. Changes in force on the strain gauge sensor may cause the sensor output to vary about the bias voltage (e.g., ±50 millivolts). The measurement circuit 100 can be used to subtract out the 5V and the output of the sensor can be monitored using a circuit having a much lower circuit supply voltage. In another example, the sensor may be a capacitive sensor with a bias voltage resulting from the charge on the sensor. The sensor output may vary about the bias voltage due changes in capacitance of the sensor due to the external conditions being monitored.

The differential configuration of the measurement circuit 100 facilitates the measurement of a single ended input to the circuit, with voltages that exceed the circuit supply voltage of the op amp 105, to generate a fully differential output at a defined output common mode. Because the measurement circuit 100 is differential, it provides the benefits of fully differential signaling, such as improved power supply rejection and signal noise rejection.

Figure 2:
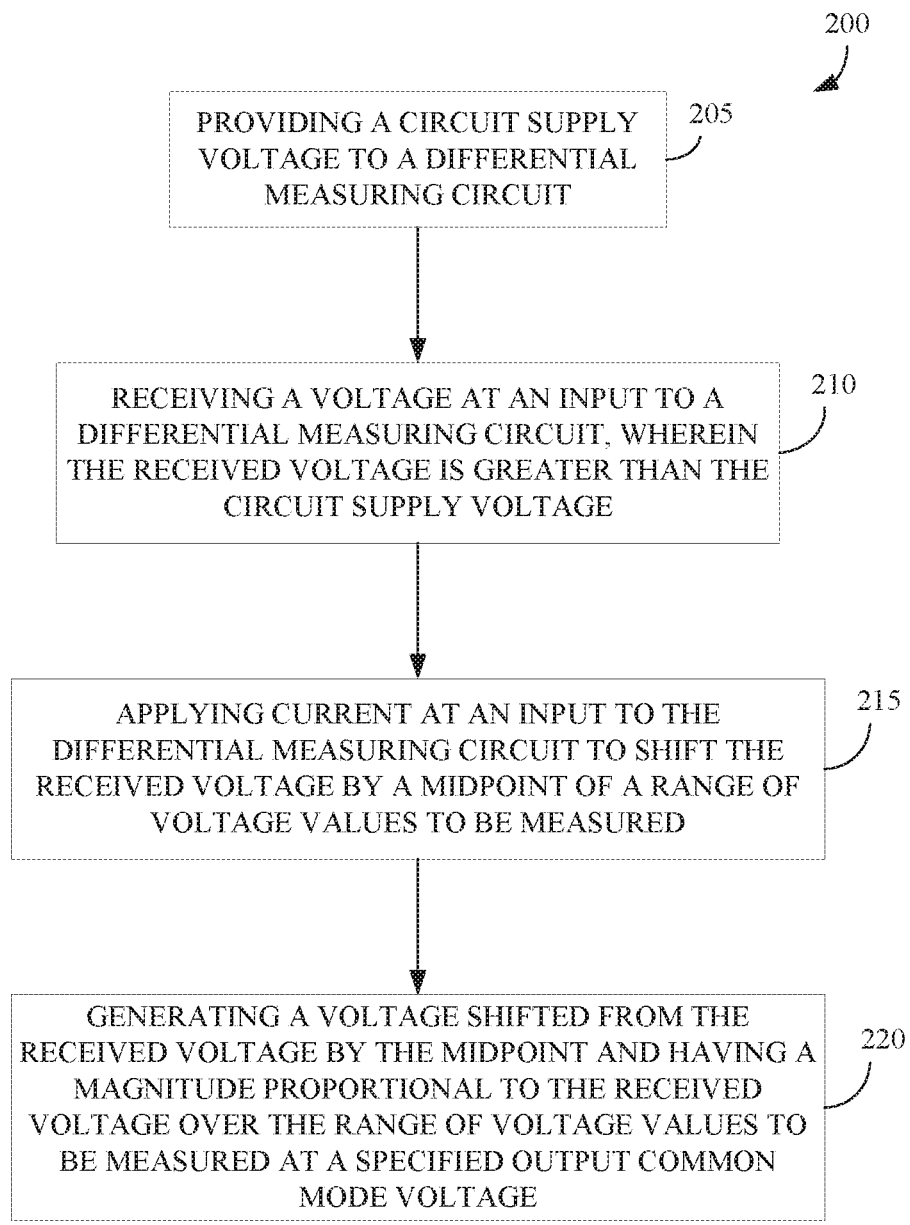
FIG. 2 is a block diagram of an example of a method for measuring a voltage having a high common mode voltage using a circuit having a low common mode voltage.

FIG. 2 is a block diagram of an example of a method for measuring a voltage having a high common mode voltage using a circuit having a low common mode voltage. At 205, a circuit supply voltage is provided to a differential measuring circuit. The differential measuring circuit may be included on an integrated circuit (IC) designed for use with a circuit supply voltage of 1.8V.

At 210, a voltage for measuring is received at an input to a differential measuring circuit. The received voltage is greater than the circuit supply voltage and may be received from a battery source or a circuit (e.g., a sensor circuit). At 215, current is applied at an input to the differential measuring circuit to shift the received voltage by a midpoint of the range of voltages to be measured by the differential measuring circuit.

At 215, a voltage is generated at the output of the differential measuring circuit. The output voltage is shifted from the received voltage by the midpoint value of the range of voltage values to be measured. The output voltage has a magnitude proportional to the received voltage at a specified output common mode voltage and is proportional over the range of voltage values to be measured.

Because the method uses current to eliminate the offset of the input voltage, noise performance is improved while providing flexibility in the choice of the measuring circuit supply voltage.

Additional Notes and Examples

Example 1 can include subject matter (such as an apparatus) comprising a differential amplifier circuit configured to receive a voltage at an input and a current source electrically connected to the input of the differential amplifier circuit. The differential amplifier circuit generates an output voltage having a magnitude proportional to the received voltage over a voltage range to be measured at a specified output common mode voltage and the current source is configured to subtract a midpoint of a voltage range of the battery voltage to be measured at the input of the differential amplifier. A circuit supply voltage provided to the differential amplifier circuit and the current source is less than the voltage at the input.

In Example 2, the subject matter of Example 1 can optionally include a common mode biasing circuit configured to adjust an input common mode voltage of the differential amplifier circuit.

In Example 3, the subject matter of one or nay combination of Examples 1 and 2 can optionally include a resistor connected to an inverting input of the differential amplifier, wherein the current source applies a value of current to the resistor to generate a voltage equal to the midpoint of the voltage range of the received voltage.

In Example 4, the subject matter of one or any combination of Examples 1-3 can optionally include a current source including a plurality of unit-sized current mirrors configured to be enabled and disabled to generate the value of current.

In Example 5, the subject matter of Example 4 can optionally include a state machine circuit configured to enable and disable the current mirrors according to a successive approximation algorithm.

In Example 6, the subject matter of one or any combination of Examples 1-5 can optionally include the voltage received at the input of the differential amplifier circuit being a battery voltage.

In Example 7, the subject matter of one or any combination of Examples 1-6 can optionally include a stacked battery voltage source and the voltage received at the input of the differential amplifier circuit is a battery voltage generated by the stacked battery voltage source.

In Example 8, the subject matter of one or any combination of Examples 1-5 optionally includes a sensor circuit having a bias voltage greater than the circuit supply voltage and the voltage received at the input to the differential amplifier circuit is generated by the sensor circuit.

In Example 9, the subject matter of one or any combination of Examples 1-8 includes the apparatus being a cellular telephone.

Example 10 can include subject matter (such as a method, a means for performing acts, or a machine-readable medium including instructions that, when performed by the machine, cause the machine to perform acts), or can optionally be combined with the subject matter of one or any combination of Examples 1-9 to include such subject matter, comprising providing a circuit supply voltage to a differential measuring circuit, receiving a voltage greater than the circuit supply voltage at an input to a differential measuring circuit, applying current at an input to the differential measuring circuit to shift the received voltage by a midpoint of a range of voltage values to be measured, and generating, at an output of the differential measuring circuit, a voltage shifted from the received voltage by the midpoint and having a magnitude proportional to the received voltage over the range of voltage values to be measured at a specified output common mode voltage.

In Example 11, the subject matter of Example 10 optionally includes adjusting an input common mode voltage of the measurement circuit to be lower than the circuit supply voltage.

In Example 12, the subject matter of one or any combination of Examples 10 and 11 optionally includes receiving a battery voltage at the input to the differential measuring circuit.

In Example 13, the subject matter of one or any combination of Examples 10-12 optionally includes receiving a voltage from a sensor circuit at the input to the differential measuring circuit.

In Example 14, the subject matter of one or any combination of Examples 10-13 optionally includes applying current from a plurality of unit-sized current mirrors, and wherein the method includes trimming the applied current by automatically selectively enabling and disabling the current mirrors.

In Example 15, the subject matter of Example 14 optionally includes trimming the applied current by selectively enabling and disabling the current mirrors according to a successive approximation algorithm.

In Example 16, the subject matter of one or any combination of Examples 10-15 optionally includes applying a value of current to a resistor electrically coupled to the input to generate a voltage equal to a midpoint of a range of voltage values to be measured.

In Example 17, the subject matter of one or any combination of Examples 10-16 optionally includes automatically trimming the applied current to minimize a difference between a voltage of the resistor and the midpoint of the range of voltage values to be measured.

Example 18 includes subject matter (such as an electronic system), or can optionally be combined with the subject matter of one or any combination of Examples 1-17 to include such subject matter, comprising a battery source having a battery voltage, a differential amplifier circuit having a non-inverting input electrically coupled to the battery source, wherein a circuit supply voltage provided to the differential amplifier circuit is less than the battery voltage, a current source electrically connected to an inverting input of the differential amplifier circuit and configured to subtract a midpoint of a voltage range of the battery source to be measured, and a common mode biasing circuit configured to adjust an input common mode voltage of the differential amplifier circuit, wherein the differential amplifier circuit generates an output having a magnitude proportional to the battery voltage over the voltage range to be measured at a specified output common mode voltage.

In Example 19, the subject matter of Example 18 optionally includes a stacked battery voltage source.

In Example 20, the subject matter of one or any combination of Examples 18 and 19 optionally includes a resistor connected to the inverting input of the differential amplifier, wherein the current source applies a value of current to the resistor to generate a voltage equal to the midpoint of the voltage range of the received voltage.

Example 21 can include, or can optionally be combined with any portion or combination of any portions of any one or more of Examples 1-20 to include, subject matter that can include means for performing any one or more of the functions of Examples 1-20, or a machine-readable medium including instructions that, when performed by a machine, cause the machine to perform any one or more of the functions of Examples 1-20.

These non-limiting examples can be combined in any permutation or combination.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An apparatus comprising:
   a differential amplifier circuit configured to receive a voltage at a non-inverting input, wherein the differential amplifier circuit generates an output voltage having a magnitude proportional to the received voltage over a voltage range to be measured at a specified output common mode voltage; and
   a current source electrically connected to an inverting input of the differential amplifier circuit configured to subtract a midpoint of a voltage range to be measured at the input of the differential amplifier, wherein a circuit supply voltage provided to the differential amplifier circuit and the current source is less than the voltage at the input.

2. The apparatus of claim 1, including a common mode biasing circuit configured to adjust an input common mode voltage of the differential amplifier circuit.

3. The apparatus of claim 1, including a resistor connected to an inverting input of the differential amplifier, wherein the current source applies a value of current to the resistor to generate a voltage equal to the midpoint of the voltage range of the received voltage.

4. The apparatus of claim 1, wherein the current source includes a plurality of unit-sized current mirrors configured to be enabled and disabled to generate the value of current.

5. The apparatus of claim 4, including a state machine circuit configured to enable and disable the current mirrors according to a successive approximation algorithm.

6. The apparatus of claim 1, wherein the voltage received at the input of the differential amplifier circuit is a battery voltage.

7. The apparatus of claim 1, including a stacked battery voltage source and the voltage received at the input of the differential amplifier circuit is a battery voltage generated by the stacked battery voltage source.

8. The apparatus of claim 1, including a sensor circuit having a bias voltage greater than the circuit supply voltage and the voltage received at the input to the differential amplifier circuit is generated by the sensor circuit.

9. The apparatus of claim 1, wherein the apparatus is a cellular telephone.

10. A method comprising:
    providing a circuit supply voltage to a differential measuring circuit;
    receiving a voltage at a non-inverting input to a differential measuring circuit, wherein the received voltage is greater than the circuit supply voltage;
    applying current at an inverting input to the differential measuring circuit to shift the received voltage by a midpoint of a range of voltage values to be measured; and
    generating, at an output of the differential measuring circuit, a voltage shifted from the received voltage by the midpoint and having a magnitude proportional to the received voltage over the range of voltage values to be measured at a specified output common mode voltage.

11. The method of claim 10, including adjusting an input common mode voltage of the measurement circuit to be lower than the circuit supply voltage.

12. The method of claim 10, wherein receiving a voltage at an input to a differential measuring circuit includes receiving a battery voltage at the input to the differential measuring circuit.

13. The method of claim 10, wherein receiving a voltage at an input to a differential measuring circuit includes receiving a voltage from a sensor circuit at the input to the differential measuring circuit.

14. The method of claim 13, wherein applying current at an input to the differential measuring circuit includes applying current from a plurality of unit-sized current mirrors, and wherein the method includes trimming the applied current by automatically selectively enabling and disabling the current mirrors.

15. The method of claim 14, wherein trimming the applied current includes trimming the applied current by selectively enabling and disabling the current mirrors according to a successive approximation algorithm.

16. The method of claim 13, wherein applying current at an input to the differential measuring circuit includes applying a value of current to a resistor electrically coupled to the input to generate a voltage equal to a midpoint of a range of voltage values to be measured.

17. The method of claim 16, including automatically trimming the applied current to minimize a difference between a voltage of the resistor and the midpoint of the range of voltage values to be measured.

18. An electronic system including:
    a battery source having a battery voltage;
    a differential amplifier circuit having a non-inverting input electrically coupled to the battery source, wherein a circuit supply voltage provided to the differential amplifier circuit is less than the battery voltage;
    a current source electrically connected to an inverting input of the differential amplifier circuit and configured to subtract a midpoint of a voltage range of the battery source to be measured; and
    a common mode biasing circuit configured to adjust an input common mode voltage of the differential amplifier circuit, wherein the differential amplifier circuit generates an output having a magnitude proportional to the battery voltage over the voltage range to be measured at a specified output common mode voltage.

19. The electronic system of claim 18, wherein the battery source is a stacked battery voltage source.

20. The electronic system of claim 18, including a resistor connected to the inverting input of the differential amplifier, wherein the current source applies a value of current to the resistor to generate a voltage equal to the midpoint of the voltage range of the received voltage.

* * * * *